(12) United States Patent
Akiyama et al.

(10) Patent No.: US 11,927,539 B2
(45) Date of Patent: Mar. 12, 2024

(54) INSPECTION APPARATUS AND INSPECTION METHOD

(71) Applicant: TOKYO ELECTRON LIMITED, Tokyo (JP)

(72) Inventors: Naoki Akiyama, Yamanashi (JP); Hiroyuki Nakayama, Yamanashi (JP); Susumu Saito, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 400 days.

(21) Appl. No.: 17/291,207

(22) PCT Filed: Oct. 24, 2019

(86) PCT No.: PCT/JP2019/041693
§ 371 (c)(1),
(2) Date: May 4, 2021

(87) PCT Pub. No.: WO2020/095699
PCT Pub. Date: May 14, 2020

(65) Prior Publication Data
US 2021/0356405 A1    Nov. 18, 2021

(30) Foreign Application Priority Data
Nov. 6, 2018 (JP) .................. 2018-209201

(51) Int. Cl.
*G01N 21/88* (2006.01)
*G01N 21/95* (2006.01)
(Continued)

(52) U.S. Cl.
CPC ..... *G01N 21/8806* (2013.01); *G01N 21/9501* (2013.01); *G01R 1/07307* (2013.01); *G01R 31/2656* (2013.01); *G01R 31/2831* (2013.01)

(58) Field of Classification Search
CPC ........... G01N 21/8806; G01N 21/9501; G01R 1/07307; G01R 31/2656; G01R 31/2831
See application file for complete search history.

(56) References Cited

U.S. PATENT DOCUMENTS 9,528,924 B2 * 12/2016 Tanaka ............... G01N 15/1434
9,948,815 B2 *  4/2018 Mori .................... H04N 1/4076
(Continued)

FOREIGN PATENT DOCUMENTS

| JP | 2005-44853 A | 2/2005 |
| JP | 2009-170730 A | 7/2009 |
| JP | 2016-100545 A | 5/2016 |

OTHER PUBLICATIONS

PCT International Search Report and Written Opinion, PCT Application No. PCT/JP2019/041693, dated Dec. 24, 2019, 7 pages (with English translation of PCT International Search Report).

*Primary Examiner* — Hung V Nguyen
(74) *Attorney, Agent, or Firm* — Fenwick & West LLP

(57) ABSTRACT

This inspection apparatus is for inspecting an inspection subject device. The inspection subject device is formed on an object to be inspected, and is a reverse-side irradiation-type imaging device into which light enters from the reverse side opposite to the side where a wiring layer is provided. This inspection apparatus has: a placement table having a transparent surface on which the object to be inspected is placed; a light irradiation mechanism that is provided in the placement table and that irradiates the to-be-inspected object placed on the placement table with light through the placement surface; and an acquisition unit that acquires in-plane distribution of illuminance of light from the placement table.

7 Claims, 7 Drawing Sheets

(51) Int. Cl.
*G01R 1/073* (2006.01)
*G01R 31/265* (2006.01)
*G01R 31/28* (2006.01)

(56) References Cited

U.S. PATENT DOCUMENTS 11,007,708 B2 * 5/2021 Medalsy ................ B33Y 50/02
2016/0370461 A1 * 12/2016 Sugiura .................. G01S 17/42

* cited by examiner

INSPECTION APPARATUS AND INSPECTION METHOD

TECHNICAL FIELD

The present disclosure relates to an inspection apparatus and an inspection method.

BACKGROUND

An inspection apparatus of Patent Document 1 includes a probe card disposed above a solid-state imaging device to be inspected and having probe needles that can be connected to the solid-state imaging device, a test head for supplying a power or various signals to the solid-state imaging device, and a light source unit for irradiating light to the solid-state imaging device. In this inspection apparatus, the probe card disposed above the solid-state imaging device is disposed below the test head, and the light source unit is disposed above the test head. In other words, the solid-state imaging device is disposed below the probe card, and the light source unit is disposed above the probe card. Further, in this inspection apparatus, an opening is formed in the probe card so that the light from the light source unit disposed above the probe card is irradiated to the solid-state imaging device disposed below the probe card.

Patent Document 1: Japanese Patent Application Publication No. 2005-44853

SUMMARY

The technique of the present disclosure enables inspection of a reverse-side irradiation-type imaging device to be appropriately performed within a short period of time regardless of a state of a light irradiation mechanism for irradiating light to the imaging device during inspection.

In accordance with an aspect of the present disclosure, there is provided with an inspection apparatus for inspecting an inspection subject device formed at an object to be inspected, wherein the inspection subject device is a reverse-side irradiation-type imaging device into which light is incident from a reverse side opposite to a side where a wiring layer is provided, the inspection apparatus comprises a placement table having a transparent surface on which the object to be inspected is placed; a light irradiation mechanism disposed in the placement table and configured to irradiate light to the to-be-inspected object placed on the placement table through the placement surface; and an acquisition unit configured to acquire in-plane distribution of an illuminance of light from the placement surface.

EFFECT OF THE INVENTION

In accordance with the present disclosure, it is possible to appropriately perform inspection of a reverse-side irradiation-type imaging device within a short period of time regardless of a state of a light irradiation mechanism for irradiating light to the imaging device during inspection.

DETAILED DESCRIPTION

Figure 1:
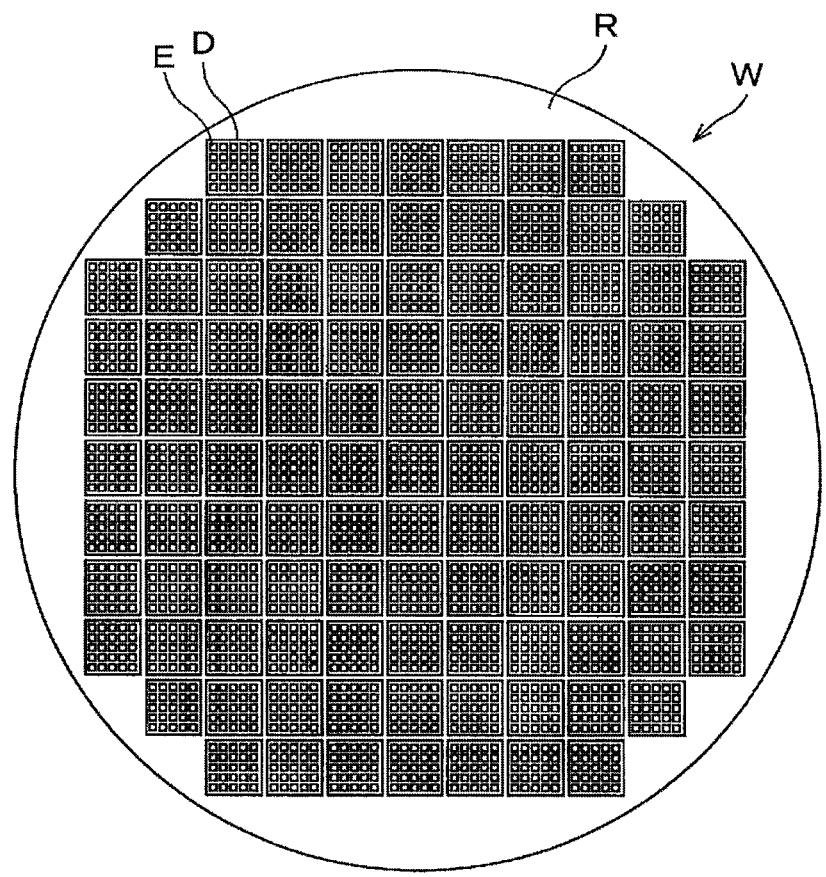
FIG. 1 is a plan view schematically showing a configuration of a wafer on which reverse-side irradiation-type imaging devices are formed.

In a semiconductor manufacturing process, a multiple number of semiconductor devices having a circuit pattern are formed on a semiconductor wafer (hereinafter, simply referred to as "wafer"). Inspection of electrical characteristics is performed on these semiconductor devices and the semiconductor devices are classified into defective products or non-defective products. An inspection apparatus referred to as a prober or the like performs inspection of the semiconductor devices on the wafer before the semiconductor devices are individually cut out. In the inspection apparatus, a probe card having multiple probe needles is disposed above the wafer, i.e., above the semiconductor devices. The probe card and the semiconductor device become close to each other during inspection. Next, in a state where the probe needles are in contact with electrodes of the semiconductor devices, electric signals are supplied to the semiconductor devices from the test head disposed above the probe card through the probe needles. Then, whether the semiconductor devices are defective or not is determined based on the electric signals supplied from the semiconductor devices to the test head through the probe needles.

When the semiconductor device is an imaging device such as a CMOS sensor and the like, the inspection is performed while irradiating light to the imaging device (see Patent Document 1), unlike other general semiconductor devices.

In the inspection apparatus of Patent Document 1, as described above, the solid-state imaging device is disposed below the probe card, and the light source unit is disposed above the probe card. Further, in this inspection apparatus, an opening is formed in the probe card so that the light from the light source unit disposed above the probe card is irradiated to the solid-state imaging device disposed below the probe card.

When the light source unit is disposed above the probe card as in Patent Document 1, it is necessary to form openings in the probe card. Therefore, the number of probe needles that can be formed at the probe card is limited compared to the case where the openings are not formed and, thus, an inspection time is increased. Particularly, when the number of electrodes to be brought into contact with the probe needles increases due to a memory attached to the imaging device or the like, the inspection time is further increased.

Recently, a reverse-side irradiation-type imaging device that receives light incident from a reverse side opposite to a front side where a wiring layer is formed has been developed as an imaging device. However, in the inspection apparatus in which the probe needle is disposed above the imaging device, when the light source unit is disposed above the probe card as in Patent Document 1, i.e., when the light is irradiated from a position above the imaging device during inspection, it is not possible to inspect the reverse-side irradiation-type imaging device.

Further, an inspection apparatus in which a light irradiation mechanism is disposed at a placement table having a transparent placement surface on which a wafer having an imaging device is placed to irradiate light from the placement surface toward the imaging device may be considered as the reverse-side irradiation-type imaging device. However, such an apparatus may not perform proper inspection. For example, when the light source of the light irradiation mechanism deteriorates and a driving voltage of the light source is the same before and after the deterioration, it is not possible to irradiate light having an appropriate illuminance to the imaging device after the deterioration, which makes it difficult to perform appropriate inspection. Further, when the light irradiation mechanism has multiple light sources and the driving voltage is common for the multiple light sources but it is not possible to emit light of the same intensity at the same driving voltage depending on the light sources, the illuminance of the light to be irradiated becomes different depending on the position of the imaging device to be inspected, which makes it difficult to perform appropriate inspection.

Therefore, the technique of the present disclosure enables the reverse-side irradiation-type imaging device to be inspected appropriately within a short period of time regardless of the state of the light irradiation mechanism for irradiating light to the corresponding imaging device during the inspection.

Hereinafter, the inspection apparatus and the inspection method according to the present embodiment will be described with reference to the accompanying drawings. Like reference numerals will be given to like parts having substantially the same functions throughout this specification and the drawings, and redundant description thereof will be omitted.

Since the technique of the present disclosure is related to the inspection of the reverse-side irradiation-type imaging device, the reverse-side irradiation-type imaging device will be described first.

Figure 2:
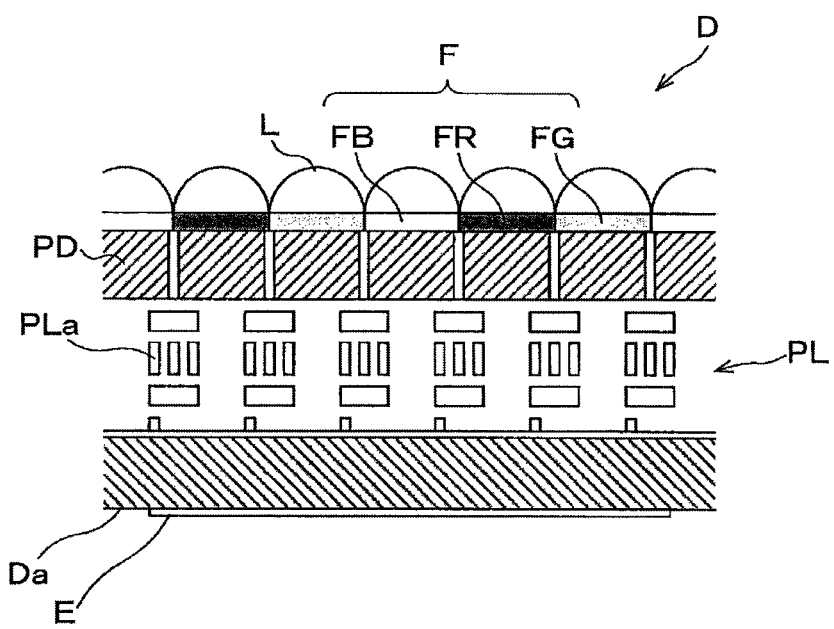
FIG. 2 is a cross-sectional view schematically showing a configuration of the reverse-side irradiation-type imaging device.

FIG. 1 is a plan view schematically showing a configuration of a wafer as an inspection object having reverse-side irradiation-type imaging devices. FIG. 2 is a cross-sectional view schematically showing a configuration of the reverse-side irradiation-type imaging device.

As shown in FIG. 1, multiple reverse-side irradiation-type imaging devices D are formed on a substantially disc-shaped wafer W.

The reverse-side irradiation-type imaging device D is a solid-state imaging device, and includes a photoelectric conversion unit PD that is a photodiode and a wiring layer PL including a plurality of wirings PLa as shown in FIG. 2. Further, in the reverse-side irradiation-type imaging device D, when the wiring layer PL side is set to a front surface side of the wafer W, the light incident from the backside of the wafer W is received by the photoelectric conversion unit PD through an on-chip lens L and a color filter F. The color filter F includes a red color filter FR, a blue color filter FB, and a green color filter FG.

Further, electrodes E are formed on a surface Da of the reverse-side irradiation-type imaging device D, i.e., the surface of the wafer W, and the electrodes E are electrically connected to the wiring PLa of the wiring layer PL. The wiring PLa is used for inputting an electric signal to a circuit element in the reverse-side irradiation-type imaging device D or outputting the electric signal from the circuit element to the outside of the reverse-side irradiation-type imaging device D.

As shown in FIG. 1, a non-device formation region R where the reverse-side irradiation-type imaging device D is not formed exists at an outer peripheral portion of the wafer W.

First Embodiment

Next, an inspection apparatus according to a first embodiment will be described.

Figure 3:
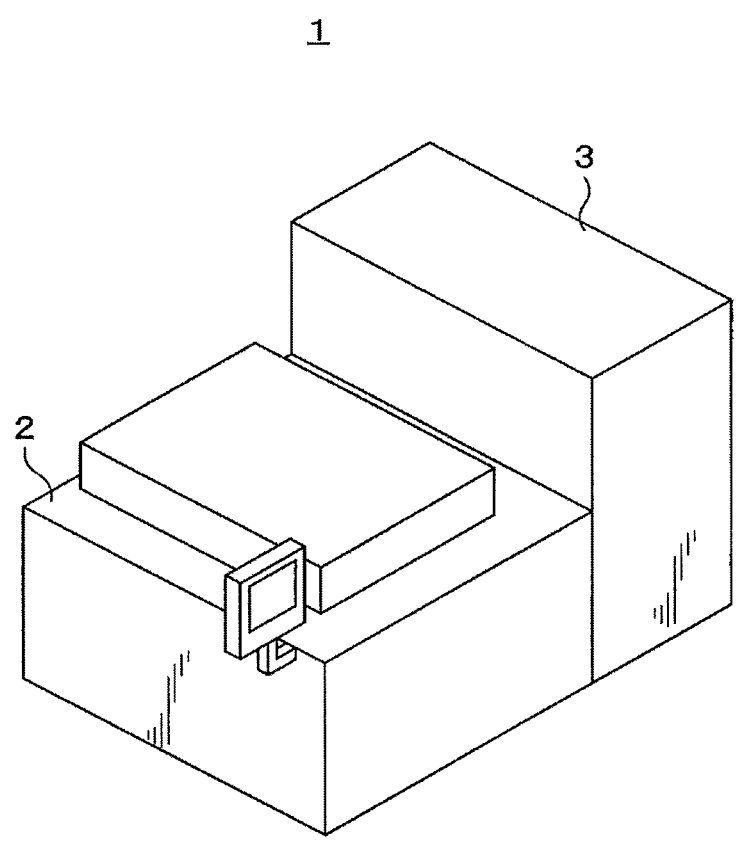
FIG. 3 is a perspective view showing an outline of a configuration of a prober as an inspection apparatus according to a first embodiment.
Figure 4:
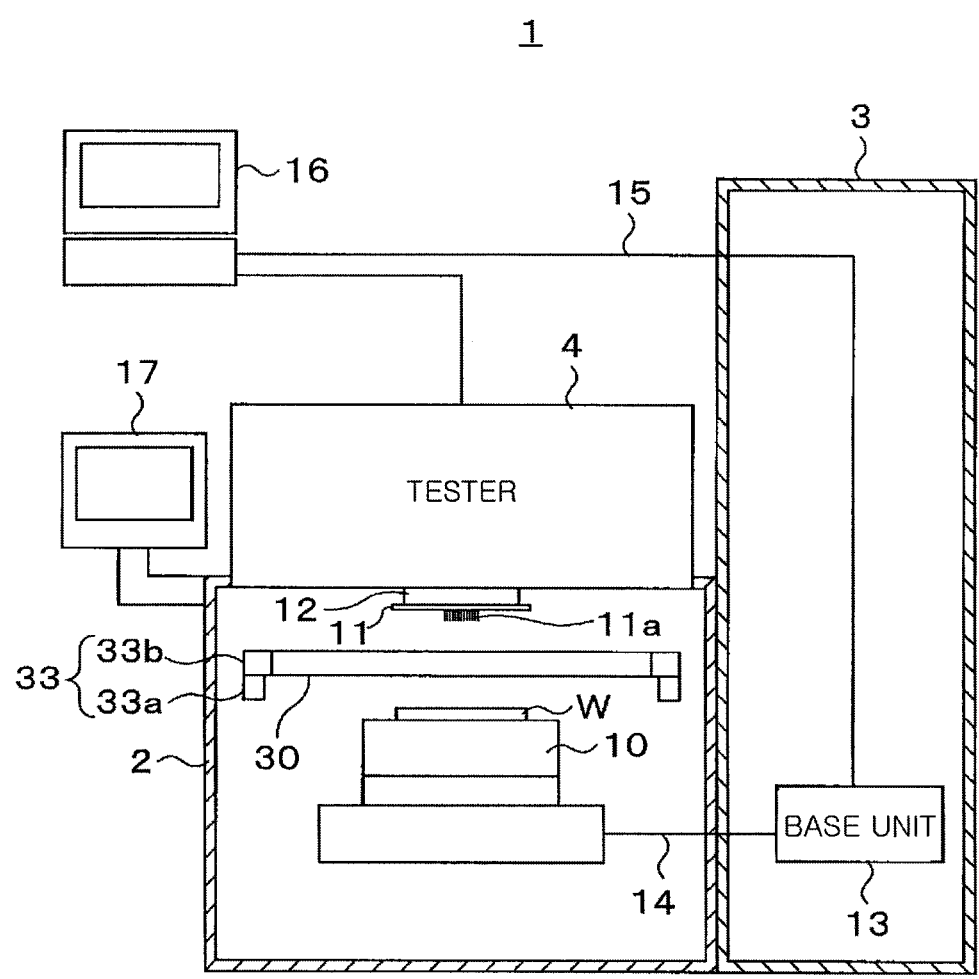
FIG. 4 is a front view showing the outline of the configuration of the prober as the inspection apparatus according to the first embodiment.

FIGS. 3 and 4 are a perspective view and a front view showing an outline of a configuration of a prober 1 as the inspection apparatus according to the first embodiment, respectively. In FIG. 4, a part of the configuration of the prober 1 of FIG. 3 is cut out to illustrate inner components of an accommodating chamber and a loader that will be described later.

The prober 1 inspects electrical characteristics of multiple reverse-side irradiation-type imaging devices D (hereinafter, may be simply referred to as "imaging devices D") formed on the wafer W. As shown in FIGS. 3 and 4, the prober 1 includes an accommodating chamber 2, a loader 3 disposed adjacent to the accommodating chamber 2, and a tester 4 disposed to cover the accommodating chamber 2.

The accommodating chamber 2 is a hollow housing and has therein a stage 10 as a placement table on which a wafer W is placed. The stage 10 holds the wafer W by holding the non-device formation region R (see FIG. 1) formed at the outer peripheral portion of the wafer W to avoid deviation of the position of the wafer W from the stage 10. The stage 10 is configured to be movable in a horizontal direction and a vertical direction, and the electrodes E on the surface of the wafer W can be brought into contact with probes 11a of a probe card 11 by adjusting the relative position of the probe card 11 and the wafer W that will be described later.

Further, the probe card 11 is disposed above the stage 10 to face the stage 10 in the accommodating chamber 2. The probe card 11 has multiple needle-shaped probes 11a formed to correspond to the electrodes E on the surface of the wafer W.

The probe card 11 is connected to a tester 4 through an interface 12. When the probes 11a are brought into contact with the electrodes E of each imaging device D on the wafer W, the probes 11a supply a power from the tester 4 to the imaging device D through the interface 12 or transmits a signal from the imaging device D to the tester 4 through the interface 12.

A sensor bridge 30 and a reciprocating mechanism 33 disposed in the accommodating chamber 2 will be described later.

The loader 3 unloads a wafer W accommodated in a FOUP (not shown) that is a transfer container and transfers the unloaded wafer W to the stage 10 of the accommodating chamber 2. Further, the loader 3 receives a wafer W having imaging devices D whose electrical characteristics have been inspected from the stage 10 and accommodates the wafer W in the FOUP.

The loader 3 has a base unit 13 as a controller for controlling a power supply and the like. The base unit 13 is connected to the stage 10 through a wiring 14 and is connected to a tester computer 16 through a wiring 15. The base unit 13 controls an operation of a light emitting unit (to be described later) of the stage 10 based on an input signal from the tester computer 16. Further, the base unit 13 controls an operation of supplying a power to the heater 42b (to be described later) of the stage 10 using a temperature measuring mechanism (not shown) of the stage 10. The base unit 13 may be disposed in the accommodating chamber 2.

The tester 4 has a test board (not shown) that reproduces a part of a circuit configuration of a motherboard on which the imaging devices D are mounted. The test board is connected to the tester computer 16. The tester computer 16 determines whether the imaging devices D are defective or not based on the signals from the imaging devices D. In the tester 4, circuit configurations of multiple types of motherboards can be reproduced by replacing the test board.

The prober 1 includes a user interface unit 17. The user interface unit 17 is used for displaying information for a user or for allowing a user to input a command. The user interface 17 is, e.g., a touch panel or a display panel having a keyboard or the like.

In the prober 1 configured as described above, when the electrical characteristics of the imaging devices D are inspected, the tester computer 16 transmits data to the test board connected to the imaging devices D through the probes 11a. Then, the tester computer 16 determines whether or not the transmitted data has been correctly processed by the test board based on the electric signal from the test board.

Next, the internal structure of the accommodating chamber 2 will be further described with reference to FIG. 5.

Figure 5:
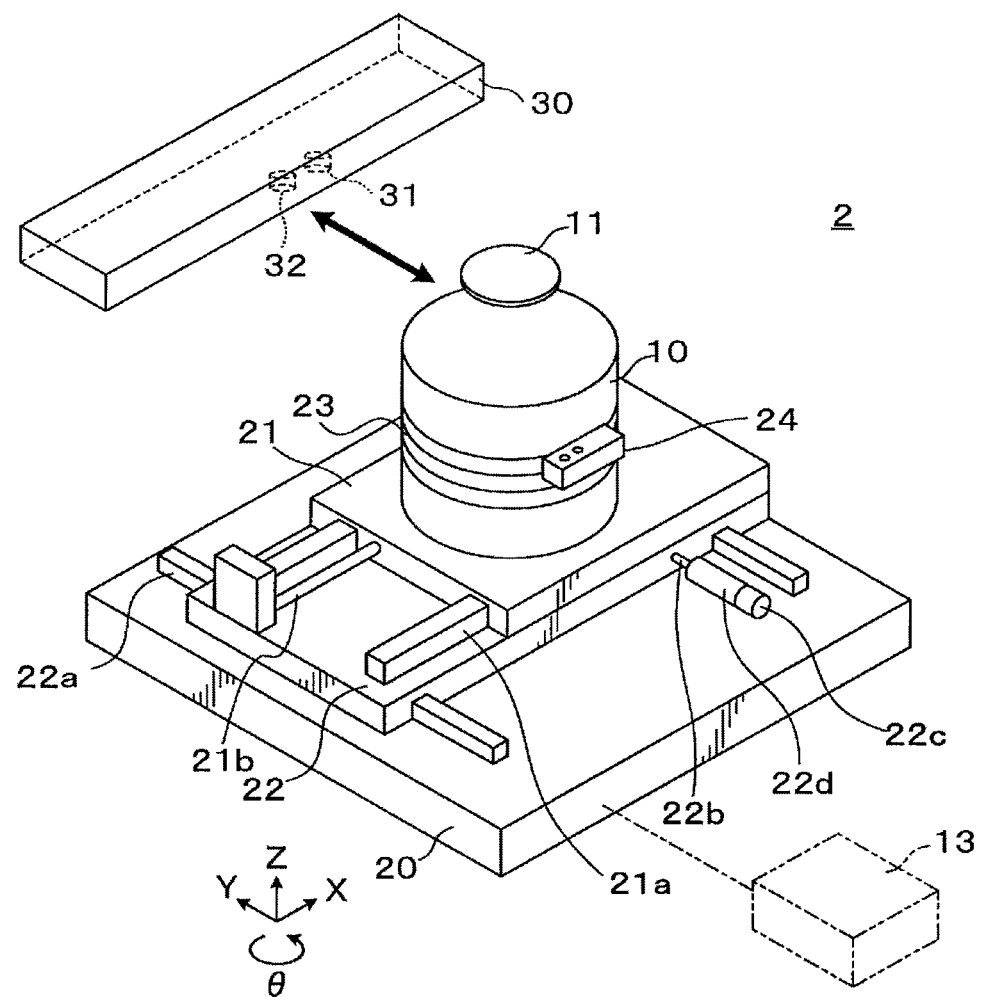
FIG. 5 is a perspective view showing an outline of an internal structure of an accommodating chamber.

FIG. 5 is a perspective view showing an outline of the internal structure of the accommodating chamber 2.

As shown in FIG. 5, in the accommodating chamber 2, the stage 10 includes an X-direction moving unit 21 disposed on the base 20 and moving along the X-direction in FIG. 5, a Y-direction moving unit 22 moving along the Y-direction in FIG. 5, and a Z-direction moving unit 23 moving along the Z-direction in FIG. 5. The X-direction moving unit 21, the Y-direction moving unit 22, and the Z-direction moving unit 23 constitute a moving mechanism for relatively moving the stage 10 and the illuminance sensor 32 to be described later.

The X-direction moving unit 21 moves the stage 10 in the X-direction by rotating a ball screw 21b along a guide rail 21a extending in the X-direction. The ball screw 21b is rotated by a motor (not shown). Further, an encoder (not shown) combined with the motor can detect the amount of movement of the stage 10.

The Y-direction moving unit 22 moves the stage 10 in the Y-direction by rotating a ball screw 22b along a guide rail 22a extending in the Y-direction. The ball screw 22b is rotated by a motor 22c. Further, an encoder 22d combined with the motor 22c can detect the movement amount of the stage 10.

With this configuration, the X-direction moving unit 21 and the Y-direction moving unit 22 move the stage 10 in the X-direction and the Y-direction that are orthogonal to each other along the horizontal plane.

The Z-direction moving unit 23 has a motor and an encoder (both not shown), and is configured to vertically move the stage 10 along the Z-direction and detect the amount of movement of the stage 10. The Z-direction moving unit 23 moves the stage 10 toward the probe card 11 to bring the electrodes of the imaging devices D formed on the wafer W into contact with the probes. Further, the stage 10 is rotatable in the θ direction in the drawing on the Z-direction moving unit 23 by a motor (not shown).

Further, a lower imaging unit 24 is disposed in the accommodating chamber 2.

The lower imaging unit 24 images the probes 11a formed at the probe card 11. The lower imaging unit 24 includes a lower camera (not shown), e.g., a complementary metal oxide semiconductor (CMOS) camera or the like, and an optical system (not shown) for guiding light from an imaging target to the lower camera. The lower imaging unit 24 images the probes 11a formed at the probe card 11 using the lower camera, and the imaging result is outputted to the base unit 13 so that the electrodes on the wafer W can be aligned with the probes 11a, for example.

The lower imaging unit 24 is fixed to the stage 10 and moved in the X-direction, the Y-direction, and the Z-direction together with the stage 10.

In the accommodating chamber 2, a sensor bridge 30 serving as a mounting unit is disposed between the stage 10 and the probe card 11. The sensor bridge 30 includes an upper camera 31 serving as an imaging unit and an illuminance sensor 32 serving as an illuminance measuring unit.

The upper camera 31 for imaging the wafer W or the like may be, e.g., a CMOS camera or the like. An optical system may be provided for the upper camera 31 as well as the lower camera.

As will be described later, the illuminance sensor 32 acquires the in-plane distribution of the illuminance of the light irradiated from the placement surface 10a of the wafer W on the stage 10. The illuminance sensor 32 measures the illuminance of light from a part of the placement surface 10a. In the following description, an area (hereinafter, referred to as "unit area") on the placement surface 10a where the illuminance sensor 32 measures the illuminance once is assumed to be an area corresponding to one imaging device D.

The imaging result from the upper camera 31 or the measurement result from the illuminance sensor 32 is outputted to the base unit 13.

The sensor bridge 30 is provided with a reciprocating mechanism 33 (see FIG. 4). The reciprocating mechanism 33 includes a guide rail 33a for guiding the reciprocation of the sensor bridge 30, and a driving unit 33b that is a combination of a motor and a ball screw and configured to drive the sensor bridge 30 to move along the guide rail 33a. The reciprocating mechanism 33 relatively reciprocates the sensor bridge 30, i.e., the illuminance sensor 32, with respect to the area facing the placement surface 10a of the stage 10. Specifically, the reciprocating mechanism 33 moves the illuminance sensor 32 between an area outside the placement surface 10a of the stage 10 in plan view and a predetermined area facing the placement surface 10a.

Figure 6:
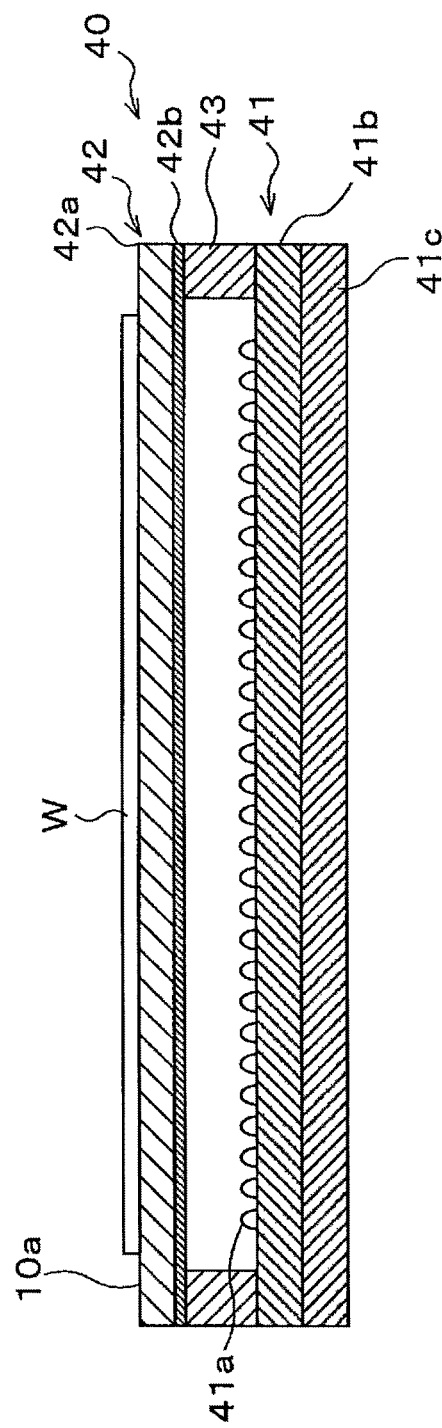
FIG. 6 is a cross-sectional view schematically showing a configuration of a stage.

Next, the configuration of the stage 10 will be described. FIG. 6 is a cross-sectional view schematically showing the configuration of the stage 10.

The wafer W is placed on the stage 10 such that the reverse side of the imaging device D and the stage 10 face each other. As shown in FIG. 6, the upper surface of the stage 10 serves as the placement surface 10a of the wafer W, and the placement surface 10a is transparent to light for inspection. The stage 10 is provided with a light irradiation mechanism 40 for irradiating light to the wafer W placed on the transparent placement surface 10a through the placement surface 10a. The light irradiation mechanism includes the light emitting unit 41 and a transmitting unit 42.

The light emitting unit 41 is disposed at a position opposed to the wafer W with the transmitting unit 42 interposed therebetween, and is configured to emit light toward the transmitting unit 42, i.e., the wafer W.

The light emitting unit 41 includes multiple light emitting diodes (LEDs) 41a serving as a light source, and further includes a base 41b and a heat radiation plate 41c.

Each of the LEDs 41a is directed toward the wafer W, and emits light including, e.g., light that has a wavelength in an inspection range and transmits through the transmitting unit 42. The light having a wavelength in the inspection range is, e.g., light having a wavelength in a visible light region, and may include light outside the visible light region such as infrared rays or the like depending on types of the imaging devices D.

In plan view, the region where the LEDs 41a are arranged (hereinafter, referred to as "LED formation region") overlaps with the wafer W placed on the stage 10, and the size of the LED formation region is substantially the same as that of the wafer W. The LEDs 41a are arranged at equal intervals in the LED formation region.

In the following description, it is assumed that on/off operations of the LEDs 41a are not controlled for each LED 41a but controlled collectively for all the LEDs 41a as one unit.

The base 41b has a wiring pattern (not shown) for holding and controlling the LEDs 41a.

The heat radiation plate 41c releases the heat of the LEDs 41a to the outside of the stage 10, and is made of, e.g., a metal material. The heat radiation plate 41c may have a passage through which a coolant, such as water or the like, for cooling the LED 41a passes.

The transmitting unit 42 includes a flat plate member 42a made of a light transmitting material, and the wafer W is placed thereon such that the backside of the wafer W is in contact with the flat plate member 42a. Since the flat plate member 42a is made of a light transmitting material, the placement surface 10a of the stage 10 is transparent and the light from the light emitting unit 41 can be irradiated to the wafer W placed on the placement surface 10a through the placement surface 10a. The light transmitting material is a material that transmits light having a wavelength in the inspection range.

The flat plate member 42a is formed in, e.g., a disc shape to correspond to the planar shape of the wafer W, and has a diameter that is substantially the same as that of the wafer W. For example, when the diameter of the wafer W is 300 mm, the flat plate member 42a has a diameter of about 350 mm.

The transmitting unit 42 allows the light emitted from the light emitting unit 41 toward the wafer W to be irradiated to the wafer W placed on the transmitting unit 42.

Further, the transmitting unit 42 includes a heater 42b as a temperature adjusting mechanism for adjusting the temperature of the wafer W, i.e., the imaging device D. The heater 42b is made of a light transmitting material so that the transmission of light from the light emitting unit 41 is not disturbed.

The transmitting unit 42 configured as described above is supported by the base 41b of the light emitting unit 41 through a supporting member 43, for example.

Further, the transmitting unit 42 is provided with a holding mechanism (not shown) for holding the non-device formation region R formed at the outer peripheral portion of the wafer W in order to hold the wafer W.

Figure 7:
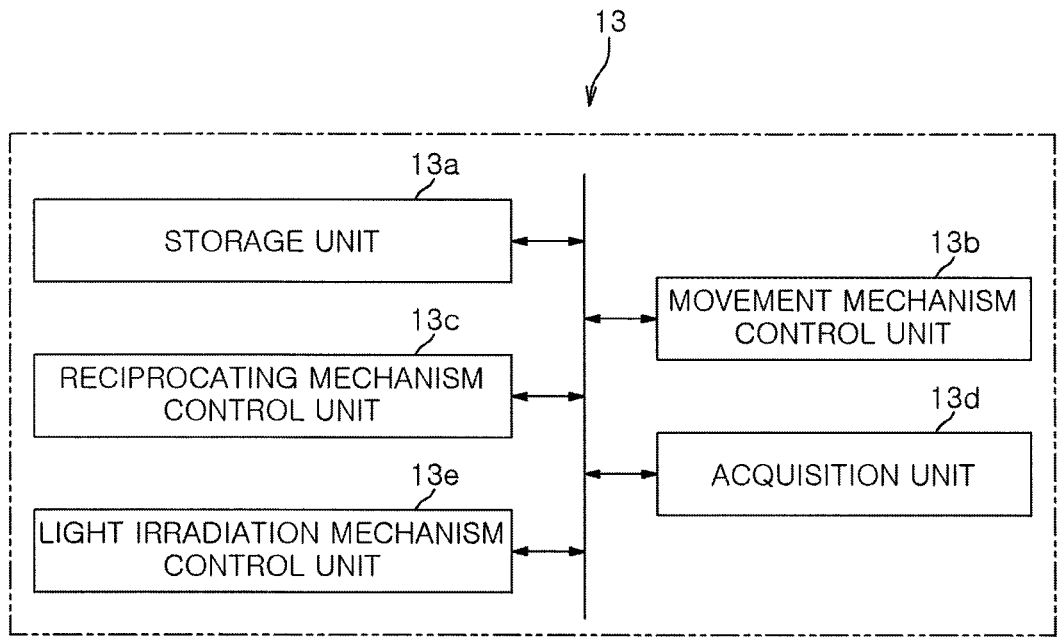
FIG. 7 is a block diagram showing an outline of a configuration related to light irradiation processing of a base unit.

Next, the configuration of the base unit 13 related to the light irradiation process will be described. FIG. 7 is a block diagram showing an outline of the configuration of the base unit 13 related to the light irradiation process.

The base unit 13 is, e.g., a computer having a CPU, a memory, or the like, and includes a program storage unit (not shown). The program storage unit stores programs for controlling various processes in the base unit 13. A part or all of the programs may be realized by dedicated hardware (circuit board).

As shown in FIG. 7, the base unit 13 includes a storage unit 13a, a movement mechanism control unit 13b, a reciprocating mechanism control unit 13c, an acquisition unit 13d, and a light irradiation mechanism control unit 13e.

The storage unit 13a stores various information related to the light irradiation process. The movement mechanism control unit 13b controls a movement mechanism including an X-direction movement unit 21, a Y-direction movement unit 22, and a Z-direction movement unit 23.

The reciprocating mechanism control unit 13c controls the reciprocating mechanism 33.

The acquisition unit 13d acquires the in-plane distribution of the illuminance of the light from the placement surface 10a. Specifically, the acquisition unit 13d acquires the in-plane distribution of the illuminance of the light from the placement surface 10a based on the illuminance of the light from each unit area on the placement surface 10a measured by the illuminance sensor 32 that is moved with respect to the stage 10 on the horizontal plane by the moving mechanism.

The light irradiation mechanism control unit 13e controls the light irradiation mechanism 40. Further, the light irradiation mechanism control unit 13e adjusts the illuminance of the irradiation light based on the in-plane distribution of the illuminance of the light irradiated through the placement surface 10a acquired by the acquisition unit 13d. The illuminance of the irradiation light is adjusted by adjusting the driving voltages of the LEDs 41a of the light emitting unit 41.

Next, an illuminance distribution acquisition process performed by the prober 1 will be described. In the illuminance distribution acquisition process, the in-plane distribution of the illuminance of the light emitted through the placement surface 10a of the stage 10 is acquired. The illuminance distribution acquisition process is performed, e.g., at the time of starting the prober 1 or performing maintenance of the prober 1, or at the time of performing quality control (QC) or the like.

In the illuminance distribution acquisition process, first, the stage 10 is moved by the X-direction moving unit 21, the Y-direction moving unit 22, and the Z-direction moving unit 23 to a predetermined position and a predetermined height on the horizontal plane. The predetermined position is, e.g., a position corresponding to one of the imaging devices formed on the wafer W, i.e., a position corresponding to one unit area on the placement surface 10a.

The sensor bridge 30 is moved by the reciprocating mechanism 33 before and after the movement of the stage or in parallel with the movement of the stage so that the sensor bridge is positioned above the stage 10.

Next, the light irradiation mechanism 40 of the stage 10 irradiates the light through the placement surface 10a of the stage 10 under the same conditions as those of the inspection, for example. Then, the illuminance of the light emitted from the unit area on the placement surface 10a of the stage 10 is measured by the illuminance sensor 32. Next, the movement of the stage 10 by the X-direction moving unit 21 and the Y-direction moving unit 22 and the measurement of the illuminance by the illuminance sensor 32 are repeated. Accordingly, the illuminance of the light from each unit area is measured for at least all portions of the placement surface 10a of the stage 10 corresponding to the imaging device formation region of the wafer W. The acquisition unit 13d acquires the in-plane distribution of the illuminance of the light emitted through the placement surface 10a of the stage 10 based on the measurement result.

Next, an example of the inspection for the wafer W using the prober 1 will be described. In the following description, it is assumed that one imaging device D is inspected in one inspection cycle.

First, the wafer W is taken out from the FOUP of the loader 3 and transferred into the accommodating chamber 2. Then, the wafer W is placed on the placement surface 10a of the stage 10 such that the reverse sides of the imaging devices D formed on the wafer W and the stage 10 face each other and the backside of the wafer W is in contact with the placement surface 10a.

Next, the stage 10 is moved by the moving mechanism including the X-direction moving unit 21 and the like, and the probes 11a disposed above the stage 10 and the electrodes E of the imaging devices D to be inspected are brought into contact with each other.

Then, the LEDs 41a of the light emitting unit 41 are turned on, and the light is emitted from the light emitting unit 41 toward the reverse sides of the imaging devices D. The emitted light transmits the transmitting unit 42 and is irradiated to the wafer W through the placement surface 10a.

When the light is irradiated to the wafer W, the light irradiation mechanism control unit 13e controls the driving voltages of the LEDs 41a to adjust the intensity of the light emitted from the LEDs 41a. Accordingly, the illuminance of the light irradiated to the wafer W through the placement surface 10a is adjusted to an appropriate value.

Here, a control example of the driving voltages of the LEDs 41a will be described.

Control Example 1

In a control example 1, the illuminance distribution of the light from the placement surface 10a is uniform on the plane.

When the illuminance distribution of the light from the placement surface 10a is uniform on the plane and the illuminance is appropriate, the driving voltages of the LEDs 41a are maintained at a predetermined value set as an inspection voltage in any inspection for the imaging devices D.

Even if the illuminance distribution is uniform on the plane, the illuminance may be different from an appropriate value due to the deterioration of the LEDs 41a or the like.

In this case, if the illuminance is smaller than the appropriate value, the driving voltages of the LEDs 41a become higher than the predetermined value due to the difference between the illuminance and the appropriate value in any inspection for the imaging devices D. The increase in the driving voltages is determined based on, e.g., light intensity-driving voltage characteristics for the LEDs 41a that are already known.

Further, when the illuminance distribution is uniform on the plane and the illuminance is greater than the appropriate value, the driving voltages of the LEDs 41a become lower than the predetermined value due to the difference between the illuminance and the appropriate value in any inspection for the imaging devices D. The decrease in the driving voltage is determined based on, e.g., the light intensity-driving voltage characteristics for the LEDs 41a that are already known.

Control Example 2

In a control example 2, the illuminance distribution of the light from the placement surface 10a is not uniform on the plane.

When the illuminance distribution of the light from the placement surface 10a is not uniform on the plane, e.g., when the illuminance of the light from the area corresponding to the imaging device D to be inspected on the placement surface 10a is appropriate, the driving voltages of the LEDs 41a are maintained at the predetermined value in the inspection of the corresponding imaging device D.

When the illuminance distribution is non-uniform on the plane, e.g., when the illuminance of the light from the area corresponding to the imaging device D to be inspected on the placement surface 10a is smaller than the appropriate value, the driving voltages of the LEDs 41a become higher than the predetermined value in the inspection for the corresponding imaging device D. Specifically, the driving voltages of the LEDs 41a become higher than the predetermined value due to the difference between the illuminance and the appropriate value. The increase in the driving voltage is determined based on, e.g., the light intensity-driving voltage characteristics for the LEDs 41a that are already known.

When the illuminance distribution is non-uniform on the plane, e.g., when the illuminance of the light from the area corresponding to the imaging device D to be inspected on the placement surface 10a is greater than an appropriate value, the driving voltages of the LEDs 41a become lower than the predetermined value in the inspection for the corresponding imaging device D. Specifically, the driving voltages of the LEDs 41a become lower than the predetermined value due to the difference between the illuminance and the appropriate value. The decrease in the driving voltage is determined based on, e.g., the light intensity-driving voltage characteristics for the LEDs 41a that are already known.

The inspection process will be further described.

The light is irradiated to the wafer W and signals for inspection are inputted to the probes 11a. Accordingly, the imaging devices D are inspected. During the inspection, the temperature of the wafer W is measured by a temperature measuring mechanism (not shown). The heater 42b is controlled based on the result, and the temperature of the wafer W is adjusted to a desired value, thereby adjusting the temperature of the imaging devices D to a desired value.

Then, the same process is repeated until the inspection of all the imaging devices D is completed.

As described above, in the present embodiment, the light irradiation mechanism 40 provided at the stage 10 irradiates light to the wafer W placed on the transparent placement surface 10a of the stage 10 through the placement surface 10a. Therefore, the reverse-side irradiation-type imaging devices D can be inspected. Further, since it is not necessary to form openings for inspection in the probe card 11, the number of probes 11a is not limited, which makes it possible to perform the inspection within a short period of time. Further, in the present embodiment, the in-plane distribution of the illuminance of the light radiated to the wafer W through the placement surface 10a of the stage 10 is acquired at a timing other than the inspection such as maintenance or the like. Then, the intensity of the light emitted from the LED 41a of the light irradiation mechanism at the time of inspection 40 is adjusted based on the acquisition result. Therefore, appropriate inspection can be performed at an appropriate illuminance regardless of the deterioration of the LEDs 41a. Further, even when the illuminance distribution of the light irradiated through the placement surface 10a is not uniform on the plane, appropriate inspection can be performed on the imaging devices formed on the wafer W at an appropriate illuminance.

Further, in the present embodiment, since the LEDs 41a are used as the light source for inspection, it is possible to avoid scaling up of the stage 10 and further to avoid the scaling up of the accommodating chamber 2 and the prober 1.

In the present embodiment, the moving mechanism includes the illuminance sensor 32 for measuring the illuminance of light from a part of the placement surface 10a, the X-direction moving unit 21 and the like, and is configured to relatively move the illuminance sensor 32 and the stage 10. Then, the in-plane distribution of the illuminance from the placement surface 10a is acquired based on the illuminance of the light from each area on the placement surface 10a measured by the illuminance sensor 32 that is moved on the horizontal plane by the moving mechanism. Therefore, the number of the illuminance sensors for acquiring the in-plane distribution can be reduced, which is cost-effective. Further, since there is one illuminance sensor 32, it is not necessary to perform calibration between the illuminance sensors 32, which is required when there are multiple illuminance sensors 32.

In the above-description, the illuminance sensor 32 is disposed at the sensor bridge 30 provided with the upper camera 31. However, the illuminance sensor 32 may be disposed at another portion in the accommodating chamber 2. Since the sensor bridge 30 is provided with the illuminance sensor 32, the reciprocating mechanism for relatively reciprocating the illuminance sensor 32 with respect to the stage 10 and the reciprocating mechanism for relatively reciprocating the upper camera 31 with respect to the stage 10 can be shared. Therefore, the scaling up of the prober 1 can be prevented.

In the above-description, the on/off operations of all the LEDs 41s are collectively controlled as one unit. However, the LEDs 41 may be divided into multiple units for each area, and the on/off operations thereof may be controlled for each unit. In this case, when a certain imaging device D is inspected, only the unit corresponding to the area where the corresponding imaging device is disposed may be turned on. Further, in this case, when the illuminance distribution of the light from the placement surface 10a acquired by the acquisition unit 13d is non-uniform on the plane, it is possible to control the LEDs 41 for each unit based on the acquired illuminance distribution such that the illuminance distribution of the light from the placement surface 10a becomes uniform.

Further, in the above-description, one imaging device D is inspected in one inspection cycle. However, a plurality of imaging devices D may be inspected all at once in one inspection cycle.

Modification of Control Example

In the control example 1, i.e., when the illuminance distribution of the light from the placement surface 10a is uniform on the plane, if the illuminance is different from the appropriate value, the increase/decrease in the driving voltages of the LEDs 41 are determined based on the intensity-driving voltage characteristics that are already known.

Instead, the following processes may be performed.

In other words, for example, in the above-described illuminance distribution acquisition process, multiple in-plane distributions of the illuminance of the light irradiated through the placement surface 10a of the stage 10 are acquired while changing the driving voltages of the LEDs 41a. Then, a relational expression between the illuminance and the driving voltages of the LEDs 41 is determined based on the acquired in-plane distributions of the illuminance, and the increase/decrease in the driving voltages of the LEDs 41 may be determined based on this relational expression.

This may be also applied to the control example 2, i.e., the case where the illuminance distribution of the light from the placement surface 10a is non-uniform on the plane. Specifically, similarly to the modification of the control example 1, multiple in-plane distributions of the illuminance of the light emitted through the placement surface 10a of the stage 10 are acquired while changing the drive voltages of the LEDs 41a. Then, a relational expression between the illuminance of the light from each unit area on the placement surface 10a and the driving voltages is determined for each unit area, and the increase/decrease in the driving voltages of the LEDs 41 in the unit area corresponding to the imaging device D to be inspected may be determined based on this relational expression.

Second Embodiment

Figure 8:
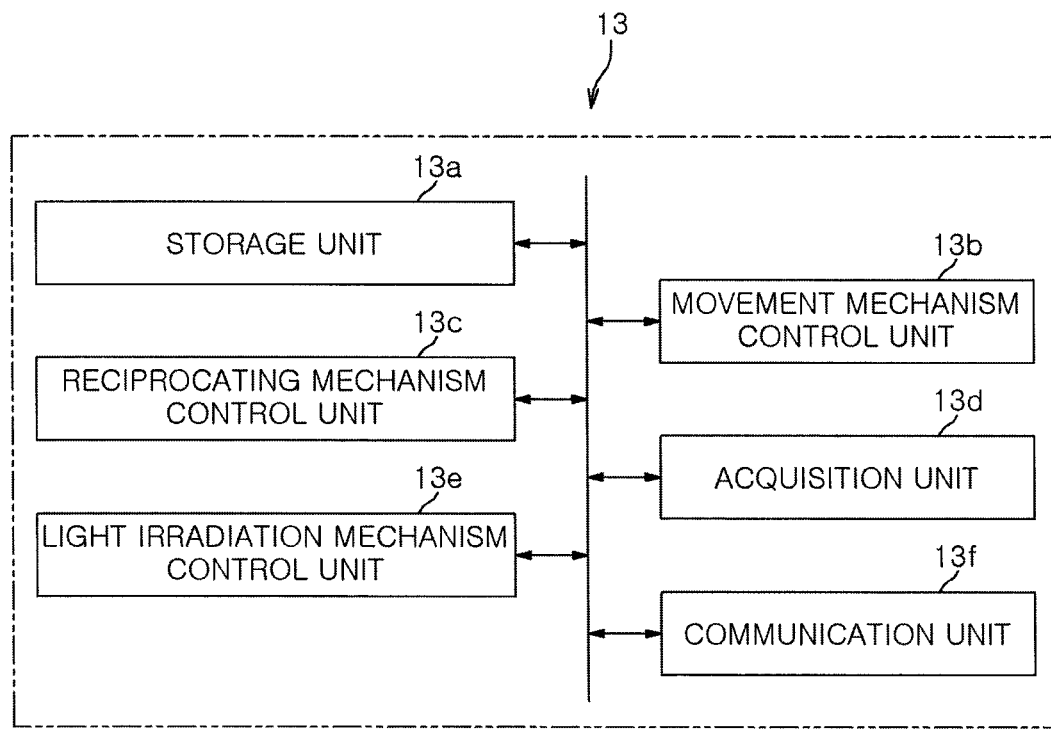
FIG. 8 is a block diagram showing an outline of a configuration of a prober as an inspection apparatus according to a second embodiment that is related to the light irradiation processing of the base unit.

FIG. 8 is a block diagram showing an outline of a configuration of the prober as an inspection apparatus according to a second embodiment that is related to the light irradiation processing of the base unit 13.

In the present embodiment, the light irradiation mechanism control unit 13e of the base unit 13 controls the light irradiation mechanism 40 as in the first embodiment. However, unlike the first embodiment, the light irradiation mechanism control unit 13e does not perform the adjustment of the irradiation light based on the in-plane distribution of the illuminance of the light irradiated through the placement surface 10a.

In the present embodiment, the base unit 13 includes a communication unit 13f for transmitting information on the in-plane distribution of the illuminance to the test device including the tester 4 and the tester computer 16. The test device supplies a power to the imaging device D and receives a signal from the imaging device D.

In the test device, the electrical characteristics for the illuminance of received light in the imaging device D to be inspected are acquired in advance in addition to the in-plane distribution of the illuminance. In the following description, the electrical characteristics for the illuminance of the received light are assumed to be the characteristics of an output current with respect to the illuminance of the received light.

At the time of inspection, in the test device, for example, the current to be outputted from the imaging device D to be inspected is calculated from the illuminance of the unit area corresponding to the imaging device D to be inspected on the placement surface 10a and the characteristics of the output current with respect to the illuminance of the received light. Then, the test device compares the calculated current value with the current value that is actually outputted from the imaging device D to be inspected, and determines whether or not the imaging device to be inspected is defective based on the comparison result.

In the present embodiment as well, the appropriate inspection can be performed regardless of the deterioration of the LEDs 41a of the light emitting unit 41. Further, even when the illuminance distribution of light irradiated through the placement surface 10a is not uniform on the plane, the appropriate inspection can be performed on the imaging devices formed on the wafer W.

Figure 9:
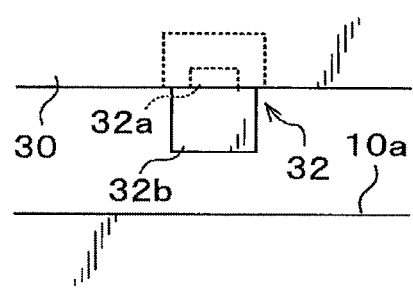
FIG. 9 is a front view for explaining another example of an illuminance sensor.

FIG. 9 is a front view for explaining another example of the illuminance sensor 32.

The illuminance sensor 32 of this example includes a limiting member 32b for limiting an incident angle of light incident on a light receiving portion 32a of the illuminance sensor 32 from the placement surface 10a. The limiting member 32b is, e.g., a cylindrical member having an inner peripheral surface coated with a black body paint, or a cylindrical member made of a black body material. Further, the limiting member 32b extends from the light receiving portion 32a toward the placement surface 10a.

Since the illuminance sensor 32 includes the limiting member 32b, it is possible to acquire the illuminance distribution of the light irradiated through the placement surface 10a and whose incident angle with respect to the light receiving portion 32a of the illuminance sensor 32 is within a specific range.

The embodiments of the present disclosure are illustrative in all respects and are not restrictive. The above-described embodiments can be embodied in various forms.

Further, the above-described embodiments may be omitted, replaced, or changed in various forms without departing from the scope of the appended claims and the gist thereof.

The following configurations are also included in the technical scope of the present disclosure.

(1) An inspection apparatus for inspecting an inspection subject device formed at an object to be inspected is provided. The inspection subject device is a reverse-side irradiation-type imaging device into which light is incident from a reverse side opposite to a side where a wiring layer is provided. The inspection apparatus includes a placement table having a transparent surface on which the object to be inspected is placed; a light irradiation mechanism disposed in the placement table and configured to irradiate light to the to-be-inspected object placed on the placement table through the placement surface; and an acquisition unit configured to acquire in-plane distribution of an illuminance of light from the placement surface.

In accordance with the configuration (1), the reverse-side irradiation-type imaging device can be inspected. Further, since it is not necessary to form an opening for inspection in the probe card, the number of probes is not limited, which makes it possible to perform the inspection within a short period of time. In the present embodiment, the in-plane distribution of the illuminance of the light irradiated through the placement surface of the placement table. Therefore, appropriate inspection can be performed regardless of the state of the light irradiation mechanism during the inspection.

(2) The inspection apparatus of the configuration (1) further includes an illuminance measuring unit configured to measure an illuminance of light from a part of the placement surface; and a moving mechanism configured to relatively move the illuminance measuring unit and the placement table. Further, the acquisition unit acquires the in-plane distribution of the illuminance of the light from the placement surface based on a measurement result of the illuminance of the light from each area on the placement surface obtained by the illuminance measuring unit that is relatively moved with respect to the placement table on a horizontal plane by the moving mechanism.

In accordance with the configuration (2), the number of the illuminance measuring unit for acquiring the in-plane distribution of the light irradiated from the placement table can be reduced, which makes it possible to reduce the cost of the inspection apparatus.

(3) The inspection apparatus of the configuration (2) further includes a reciprocating mechanism configured to relatively reciprocate the illuminance measuring unit with respect to an area facing the placement surface of the placement table.

(4) In the inspection apparatus of the configuration (3), an imaging unit is disposed at a mounting unit that is provided with the illuminance measuring unit and is relatively reciprocated with respect to the area facing the placement surface of the placement table by the reciprocating mechanism.

In accordance with the configuration (4), the illuminance measuring unit and the reciprocating mechanism of the imaging unit can be shared, so that the scaling up of the inspection apparatus can be prevented.

(5) In the inspection apparatus of any one of the configurations (2) to (4), the illuminance measuring unit has a limiting member configured to limit an incident angle of light incident on the illuminance measuring unit from the placement surface.

In accordance with the configuration (5), it is possible to acquire the in-plane distribution of the illuminance of the light irradiated through the placement surface of the placement table and whose incident angle with respect to the illuminance measuring unit is within a specific range.

(6) The inspection apparatus of any one of the configurations (1) to (5), further includes a light irradiation mechanism control unit configured to adjust an illuminance of the light irradiated from the light irradiation mechanism based on the in-plane distribution of the illuminance acquired by the acquisition unit.

(7) The inspection apparatus of any one of the configurations (1) to (6) further includes a communication unit configured to transmit information on the in-plane distribution of the illuminance acquired by the acquisition unit to a test device that supplies a power to the inspection subject device and receives a signal from the inspection subject device.

(8) There is provided an inspection method for inspecting an inspection subject device formed at an object to be inspected, by using an inspection apparatus. The inspection subject device is a reverse-side irradiation-type imaging device into which light is incident from a reverse side opposite to a side where a wiring layer is provided. The inspection apparatus includes a placement table having a transparent surface on which the object to be inspected is placed; and a light irradiation mechanism disposed in the placement table and configured to irradiate light to the to-be-inspected object placed on the placement table through the placement surface. The inspection method includes acquiring in-plane distribution of an illuminance of light from the placement surface.

DESCRIPTION OF REFERENCE NUMERALS

1: prober
10: stage
10a: placement surface
13d: acquisition unit
40: light irradiation mechanism
D: reverse-side irradiation-type imaging device
W: wafer

The invention claimed is:
1. An inspection apparatus for inspecting an inspection subject device formed at an object to be inspected, the inspection subject device being a reverse-side irradiation-type imaging device into which light is incident from a reverse side opposite to a side where a wiring layer is provided, the inspection apparatus comprising:
a placement table having a transparent surface on which the object to be inspected is placed;
a light irradiation mechanism disposed in the placement table and configured to irradiate light to the to-be-inspected object placed on the placement table through the placement surface;
an acquisition unit configured to acquire in-plane distribution of an illuminance of light from the placement surface;
an illuminance measuring unit configured to measure an illuminance of light from a part of the placement surface; and
a moving mechanism configured to relatively move the illuminance measuring unit and the placement table,
wherein the acquisition unit acquires the in-plane distribution of the illuminance of the light from the placement surface based on a measurement result of the illuminance of the light from each area on the placement surface obtained by the illuminance measuring unit that is relatively moved with respect to the placement table on a horizontal plane by the moving mechanism.

2. The inspection apparatus of claim 1, further comprising:
a reciprocating mechanism configured to relatively reciprocate the illuminance measuring unit with respect to an area facing the placement surface of the placement table.

3. The inspection apparatus of claim 2, wherein an imaging unit is disposed at a mounting unit that is provided with the illuminance measuring unit and is relatively reciprocated with respect to the area facing the placement surface of the placement table by the reciprocating mechanism.

4. The inspection apparatus of claim 1, wherein the illuminance measuring unit has a limiting member configured to limit an incident angle of light incident on the illuminance measuring unit from the placement surface.

5. The inspection apparatus of claim 1, further comprising:
a light irradiation mechanism control unit configured to adjust an illuminance of the light irradiated from the light irradiation mechanism based on the in-plane distribution of the illuminance acquired by the acquisition unit.

6. The inspection apparatus of claim 1, further comprising:
a communication unit configured to transmit information on the in-plane distribution of the illuminance acquired by the acquisition unit to a test device that supplies a power to the inspection subject device and receives a signal from the inspection subject device.

7. An inspection method for inspecting an inspection subject device formed at an object to be inspected, by using an inspection apparatus, the inspection subject device being a reverse-side irradiation-type imaging device into which light is incident from a reverse side opposite to a side where a wiring layer is provided, the inspection apparatus including: a placement table having a transparent surface on which the object to be inspected is placed; a light irradiation mechanism disposed in the placement table and configured to irradiate light to the to-be-inspected object placed on the placement table through the placement surface; an illuminance measuring unit configured to measure an illuminance of light from a part of the placement surface; and a moving mechanism configured to relatively move the illuminance measuring unit and the placement table, the inspection method comprising:
acquiring in-plane distribution of an illuminance of light from the placement surface based on a measurement result of the illuminance of the light from each area on the placement surface obtained by the illuminance measuring unit that is relatively moved with respect to the placement table on a horizontal plane by the moving mechanism.

* * * * *